US008352832B2

(12) United States Patent
Khisti et al.

(10) Patent No.: US 8,352,832 B2
(45) Date of Patent: Jan. 8, 2013

(54) UNEQUAL DELAY CODES FOR BURST-ERASURE CHANNELS

(75) Inventors: Ashish Khisti, Toronto (CA); Jatinder Pal Singh, Mountain View, CA (US)

(73) Assignee: Deutsche Telekom AG, Bonn (DE)

( * ) Notice: Subject to any disclaimer, the term of this patent is extended or adjusted under 35 U.S.C. 154(b) by 800 days.

(21) Appl. No.: 12/488,206

(22) Filed: Jun. 19, 2009

(65) Prior Publication Data

US 2010/0325521 A1 Dec. 23, 2010

(51) Int. Cl.
*H03M 13/00* (2006.01)

(52) U.S. Cl. ......................... 714/762; 714/786; 714/704

(58) Field of Classification Search .................. 714/762, 714/786, 783, 777, 784, 704, 792; 702/191
See application file for complete search history.

(56) References Cited

U.S. PATENT DOCUMENTS

| | | | | |
|---|---|---|---|---|
| 3,798,066 | A * | 3/1974 | Evans | 134/27 |
| 6,553,535 | B1 * | 4/2003 | Asada et al. | 714/777 |
| 6,611,795 | B2 * | 8/2003 | Cooper | 702/191 |
| 6,694,478 | B1 | 2/2004 | Martinian et al. | |
| 7,415,061 | B2 * | 8/2008 | Currivan et al. | 375/144 |
| 7,921,351 | B2 * | 4/2011 | Williams et al. | 714/784 |

OTHER PUBLICATIONS

Byers et al., A Digital Fountain Approach to Reliable Distribution of Bulk Data, Computer Communication Review, 1998, vol. 28; No. 4, pp. 56-67.
Li et al., Forward and Retransmitted Systematic Lossy Error Protection for IPTV Video Multicast, Proc. International Packet Video Workshop—PV2009, Seattle, WA, May 2009. Submitted.
Martinian et al., Burst Erasure Correction Codes With Low Decoding Delay, IEEE Transactions on Information Theory, Oct. 2004.
Martinian et al., Delay-optimal Burst Erasure Code Construction, International Symposium on Information Theory, (Nice, France) Jul. 2007.
Mitzenmacher, Digital Fountains: A Survey and Look Forward, Information theory workshop, San Antonio, TX, 2004.

* cited by examiner

*Primary Examiner* — Fritz Alphonse
(74) *Attorney, Agent, or Firm* — Leydig, Voit & Mayer, Ltd.

(57) ABSTRACT

An error correction code includes a separate error code portion for each of two or more separate burst erasure durations (or burst error durations). For each burst erasure duration, the code can be employed to recover from the burst erasure with a different delay time. Each error code portion has a particular parameter for burst duration (B) and delay (T), meaning that the code can be used to recover from a burst erasure of duration B with delay T. Each error code portion is based on separating the source symbols into sub-symbols and diagonally interleaving the sub-symbols based on the (B,T) parameters for the error code portion. Accordingly, different burst erasures are recovered from with different delays.

21 Claims, 10 Drawing Sheets

| $x[i-2]$ | $x[i-1]$ | $x[i]$ | $x[i+1]$ | $x[i+2]$ | $x[i+3]$ |
|---|---|---|---|---|---|
| $s_0[i-2]$ | $s_0[i-1]$ | $s_0[i]$ | $s_0[i+1]$ | $s_0[i+2]$ | $s_0[i+3]$ |
| $s_1[i-2]$ | $s_1[i-1]$ | $s_1[i]$ | $s_1[i+1]$ | $s_1[i+2]$ | $s_1[i+3]$ |
| $s_2[i-2]$ | $s_2[i-1]$ | $s_2[i]$ | $s_2[i+1]$ | $s_2[i+2]$ | $s_2[i+3]$ |
| $s_3[i-2]$ | $s_3[i-1]$ | $s_3[i]$ | $s_3[i+1]$ | $s_3[i+2]$ | $s_3[i+3]$ |
| $s_0[i-6] \oplus s_2[i-4]$ | $s_0[i-5] \oplus s_2[i-3]$ | $s_0[i-4] \oplus s_2[i-2]$ | $s_0[i-3] \oplus s_2[i-1]$ | $s_0[i-2] \oplus s_2[i]$ | $s_0[i-1] \oplus s_2[i+1]$ |
| $s_1[i-6] \oplus s_3[i-4]$ | $s_1[i-5] \oplus s_3[i-3]$ | $s_1[i-4] \oplus s_3[i-2]$ | $s_1[i-3] \oplus s_3[i-1]$ | $s_1[i-2] \oplus s_3[i]$ | $s_1[i-1] \oplus s_3[i+1]$ |
| $s_0[i-4] \oplus s_2[i-3]$ | $s_0[i-3] \oplus s_2[i-2]$ | $s_0[i-2] \oplus s_2[i-1]$ | $s_0[i-1] \oplus s_2[i]$ | $s_0[i] \oplus s_2[i+1]$ | $s_0[i+1] \oplus s_2[i+2]$ |
| $s_1[i-4] \oplus s_3[i-3]$ | $s_1[i-3] \oplus s_3[i-2]$ | $s_1[i-2] \oplus s_3[i-1]$ | $s_1[i-1] \oplus s_3[i]$ | $s_1[i] \oplus s_3[i+1]$ | $s_1[i+1] \oplus s_3[i+2]$ |

Fig. 8

UNEQUAL DELAY CODES FOR BURST-ERASURE CHANNELS

FIELD OF THE INVENTION

The present invention relates generally to error correction codes for messages communicated over a network, and in particular but not exclusively, to an apparatus, method, system, and manufacture for error correction codes that correct the error with different delays for different burst erasure or burst error durations.

BACKGROUND OF THE INVENTION

There is a growing demand for multicasting video over wireless links due to the recent surge in the number of mobile devices such as laptops, handheld PDAs and cellular phones. The wireless channel however introduces severe impairments at the physical layer which in turn translates into severe packet losses and longer delays at the application layer, making a smooth delivery of video highly challenging. Furthermore, bandwidth comes for a huge premium in wireless systems. Accordingly, a common channel is typically shared across users intending to download the same media stream. However, the physical link characteristics of different users sharing the same wireless link are in general different and highly sensitive to their location, mobility and other aspects.

A common approach for dealing with erasures at the application layer is retransmission. The sender has a sequence of packets to send to the receiver and it continues transmitting the same packet until it is received successfully by the receiver (i.e., it receives an acknowledgement) or a timeout occurs. While retransmissions are quite effective in a point-to-point scenario, they do not scale with the number of users in a point-to-multipoint scenario.

BRIEF DESCRIPTION OF THE DRAWINGS

Non-limiting and non-exhaustive embodiments of the present invention are described with reference to the following drawings, in which:

FIG. 8 shows an embodiment of a code construction for two different burst durations;

DETAILED DESCRIPTION

Figure 1:
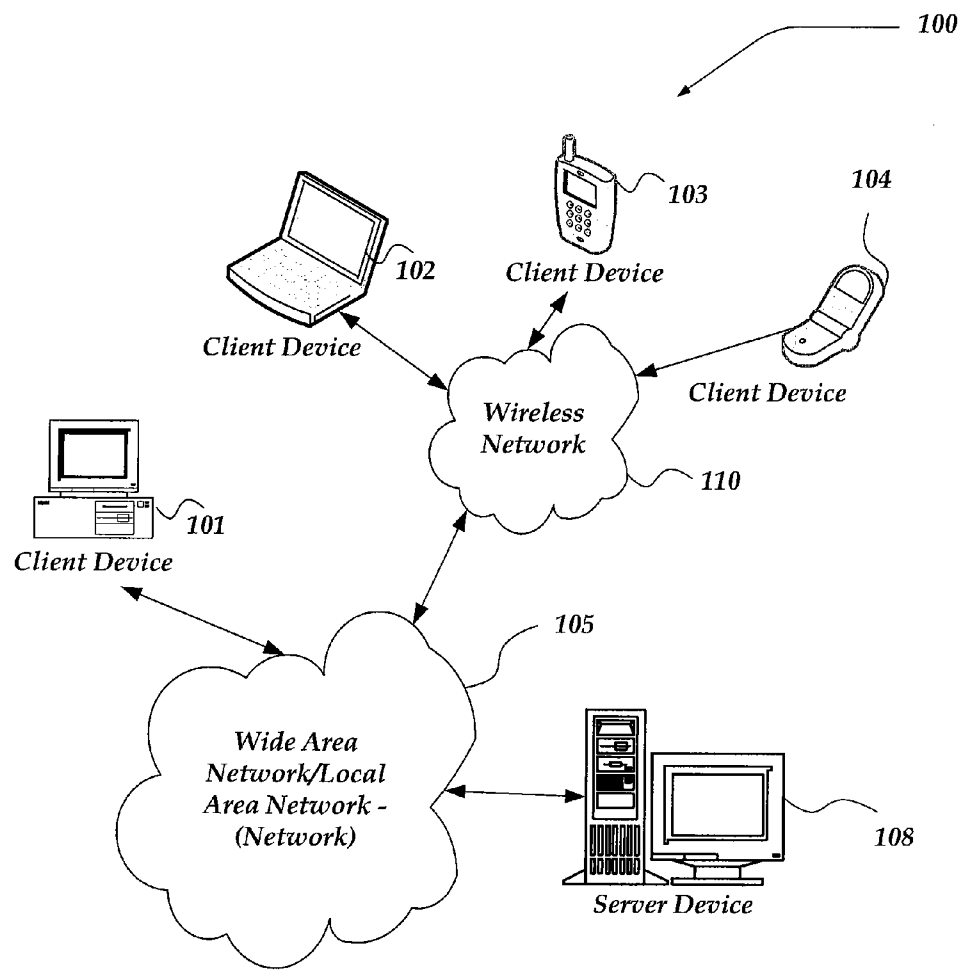
FIG. 1 shows a block diagram of an embodiment of a system for communicating over a network.

Various embodiments of the present invention will be described in detail with reference to the drawings, where like reference numerals represent like parts and assemblies throughout the several views. Reference to various embodiments does not limit the scope of the invention, which is limited only by the scope of the claims attached hereto. Additionally, any examples set forth in this specification are not intended to be limiting and merely set forth some of the many possible embodiments for the claimed invention. Among other things, the present invention may be embodied as methods or devices. Accordingly, the present invention may take the form of an entirely hardware embodiment, an entirely software embodiment or an embodiment combining software and hardware aspects. The following detailed description is, therefore, not to be taken in a limiting sense.

Throughout the specification and claims, the following terms take the meanings explicitly associated herein, unless the context clearly dictates otherwise. The phrase "in one embodiment" as used herein does not necessarily refer to the same embodiment, though it may. As used herein, the term "or" is an inclusive "or" operator, and is equivalent to the term "and/or," unless the context clearly dictates otherwise. The term "based, in part, on", "based, at least in part, on", or "based on" is not exclusive and allows for being based on additional factors not described, unless the context clearly dictates otherwise. In addition, throughout the specification, the meaning of "a," "an," and "the" include plural references. The meaning of "in" includes "in" and "on."

Briefly stated, an error correction code includes a separate error code portion for each of two or more separate burst erasure durations (or burst error durations). For each different burst erasure duration, the code can be employed to recover from the burst erasure with a different delay time. Each error code portion has a particular parameter for burst duration (B) and delay (T), meaning that the code can be used to recover from a burst erasure of duration B with delay T. Each error code portion is based on separating the source symbols into sub-symbols and diagonally interleaving the sub-symbols based on the (B,T) parameters for the error code portion. Accordingly, different burst erasures are recovered from with different delays.

Illustrative Operating Environment

FIG. 1 shows components of one embodiment of an environment in which the invention may be practiced. Not all the components may be required to practice the invention, and variations in the arrangement and type of the components may be made without departing from the spirit or scope of the invention. As shown, system 100 of FIG. 1 includes local area networks ("LANs")/wide area networks ("WANs")-(network) 105, wireless network 110, network device (service exchange) 106, client devices 101-104, and server device 108.

One embodiment of a network device such as client devices 101-104 and/or server device 108 is described in more detail below in conjunction with FIG. 4.

Generally, client devices 102-104 may include virtually any mobile computing device capable of receiving and sending communications over a network, such as wireless network 110, or the like. Such devices include portable devices such as, cellular telephones, smart phones, pagers, radio frequency (RF) devices, infrared (IR) devices, Personal Digital Assistants (PDAs), handheld computers, laptop computers, wearable computers, tablet computers, integrated devices combining one or more of the preceding devices, or the like. One embodiment of a mobile device usable as one of client devices 102-104 is described in more detail below in conjunction with FIG. 2.

Client device 101 may include virtually any computing device that typically connects using a wired communications medium such as personal computers, multiprocessor systems, microprocessor-based or programmable consumer electronics, network PCs, or the like. In one embodiment, client devices 101-104 may be configured to operate over a wired and/or a wireless network.

Client devices 101-104 typically range widely in terms of capabilities and features. For example, a cell phone may have a numeric keypad and a few lines of monochrome LCD display on which only text may be displayed. In another example, a web-enabled client device may have a touch sensitive screen, a stylus, and several lines of color LCD display in which both text and graphics may be displayed.

A web-enabled client device may include a browser application that is configured to receive and to send web pages, web-based messages, or the like. The browser application may be configured to receive and display graphics, text, multimedia, or the like, employing virtually any web based language, including a wireless application protocol messages (WAP), or the like. In one embodiment, the browser application is enabled to employ Handheld Device Markup Language (HDML), Wireless Markup Language (WML), WMLScript, JavaScript, Standard Generalized Markup Language (SMGL), HyperText Markup Language (HTML), eXtensible Markup Language (XML), or the like, to display and send communications.

Client devices 101-104 also may include at least one other client application that is configured to receive content from another computing device. The client application may include a capability to provide and receive textual content, multimedia information, or the like. The client application may further provide information that identifies itself, including a type, capability, name, or the like. In one embodiment, client devices 101-104 may uniquely identify themselves through any of a variety of mechanisms, including a phone number, Mobile Identification Number (MIN), an electronic serial number (ESN), network address, or other device identifier. The information may also indicate a content format that the client device is enabled to employ. Such information may be provided in a communication, or the like, sent to another computing device.

Client devices 101-104 may also be configured to communicate through email, Short Message Service (SMS), Multimedia Message Service (MMS), instant messaging (IM), internet relay chat (IRC), Mardam-Bey's IRC (mIRC), Jabber, or the like, with and between another computing device. However, the present invention is not limited to these communication protocols, and virtually any other communication protocol may be employed. Client devices, such as client device 112, may be configured to implement transmission of voice through the internet or other packet-switched networks through Voice-over-Internet protocol (VoIP).

Wireless network 110 is configured to couple client devices 102-104 with network 105. Wireless network 110 may include any of a variety of wireless sub-networks that may further overlay stand-alone ad-hoc networks, or the like, to provide an infrastructure-oriented connection for client devices 102-104. Such sub-networks may include mesh networks, Wireless LAN (WLAN) networks, cellular networks, or the like.

Wireless network 110 may further include an autonomous system of terminals, gateways, routers, or the like connected by wireless radio links, or the like. These connectors may be configured to move freely and randomly and organize themselves arbitrarily, such that the topology of wireless network 110 may change rapidly.

Wireless network 110 may further employ a plurality of access technologies including 2nd (2G), 3rd (3G) generation radio access for cellular systems, WLAN, Wireless Router (WR) mesh, or the like. Access technologies such as 2G, 3G, and future access networks may enable wide area coverage for client devices, such as client devices 102-104 with various degrees of mobility. For example, wireless network 110 may enable a radio connection through a radio network access such as Global System for Mobile communication (GSM), General Packet Radio Services (GPRS), Enhanced Data GSM Environment (EDGE), Wideband Code Division Multiple Access (WCDMA), Bluetooth, or the like. In essence, wireless network 110 may include virtually any wireless communication mechanism by which information may travel between client devices 102-104 and another computing device, network, or the like.

Network 105 server device 108 client device 101, and through wireless network 110 to client devices 102-104. Network 105 is enabled to employ any form of computer readable media for communicating information from one electronic device to another. Also, network 105 can include the Internet in addition to local area networks (LANs), wide area networks (WANs), direct connections, such as through a universal serial bus (USB) port, other forms of computer-readable media, or any combination thereof. On an interconnected set of LANs, including those based on differing architectures and protocols, a router acts as a link between LANs, enabling messages to be sent from one to another. Also, communication links within LANs typically include twisted wire pair or coaxial cable, while communication links between networks may utilize analog telephone lines, full or fractional dedicated digital lines including T1, T2, T3, and T4, Integrated Services Digital Networks (ISDNs), Digital Subscriber Lines (DSLs), wireless links including satellite links, or other communications links known to those skilled in the art. Furthermore, remote computers and other related electronic devices could be remotely connected to either LANs or WANs via a modem and temporary telephone link. In essence, network 105 includes any communication method by which information may travel between computing devices.

Additionally, communication media typically embodies computer-readable instructions, data structures, program modules, or wired media such as twisted pair, coaxial cable, fiber optics, wave guides, and other wired media and wireless media such as acoustic, RF, infrared, and other wireless media.

Server device 108 may be configured to send information to one or more of client device 101-104 via unicast, multicast, or the like. Server device 108 sends the information with an error correction code. One or more of network devices 101-104 are receivers of the information and the error correction code, and can decode the error correction code to recover from burst erasures or burst errors, with different burst durations resulting in a different delay time to recover from the burst erasure or burst error. In some embodiments, network devices 101-104 use the error correction code to recover from burst erasures but not burst errors. In other embodiment, network devices 101-104 use the error correction code to recover from burst errors and burst errors such as data corruption.

Figure 2:
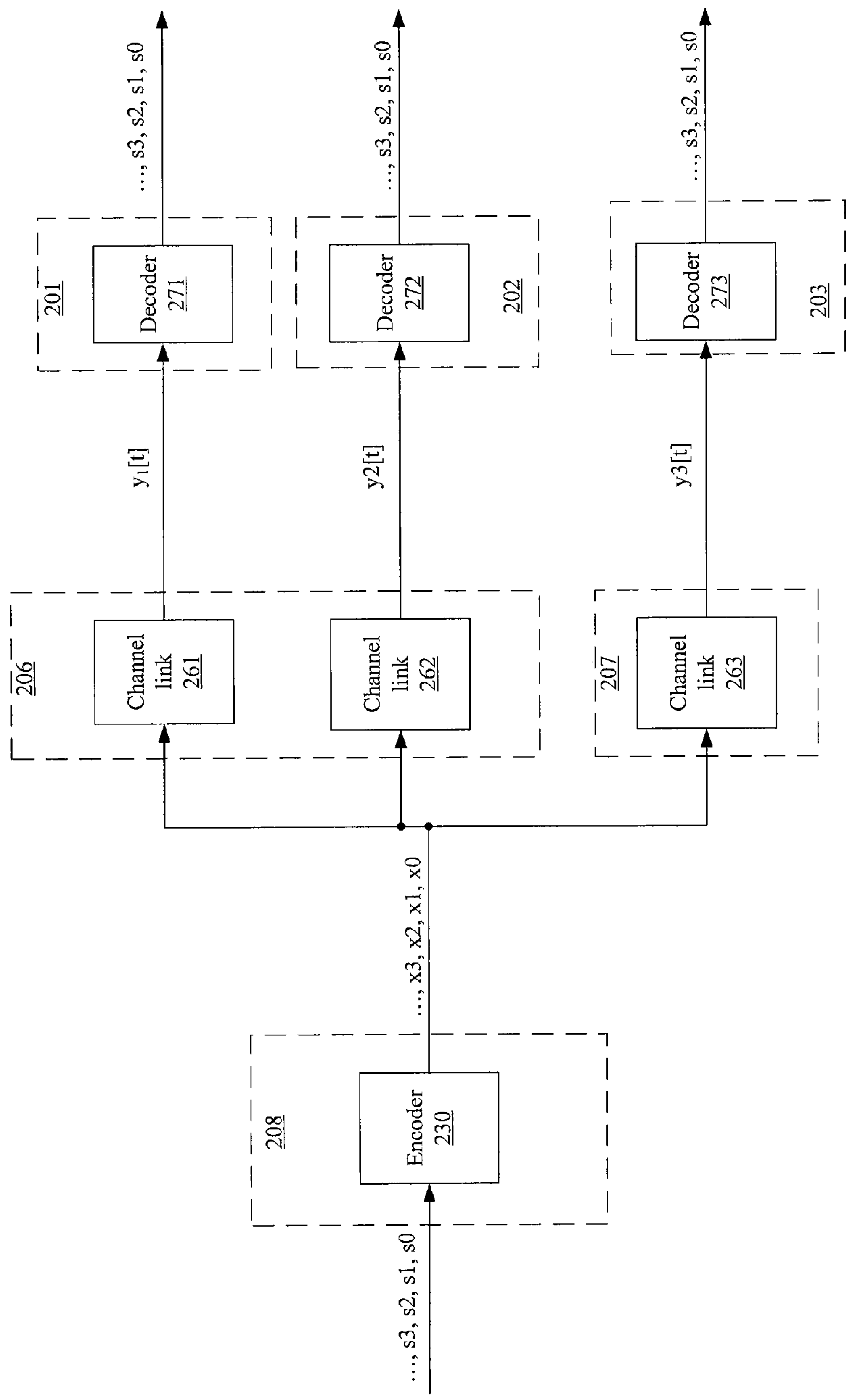
FIG. 2 illustrates a block diagram of one embodiment of the system of FIG. 1.
Figure 3:
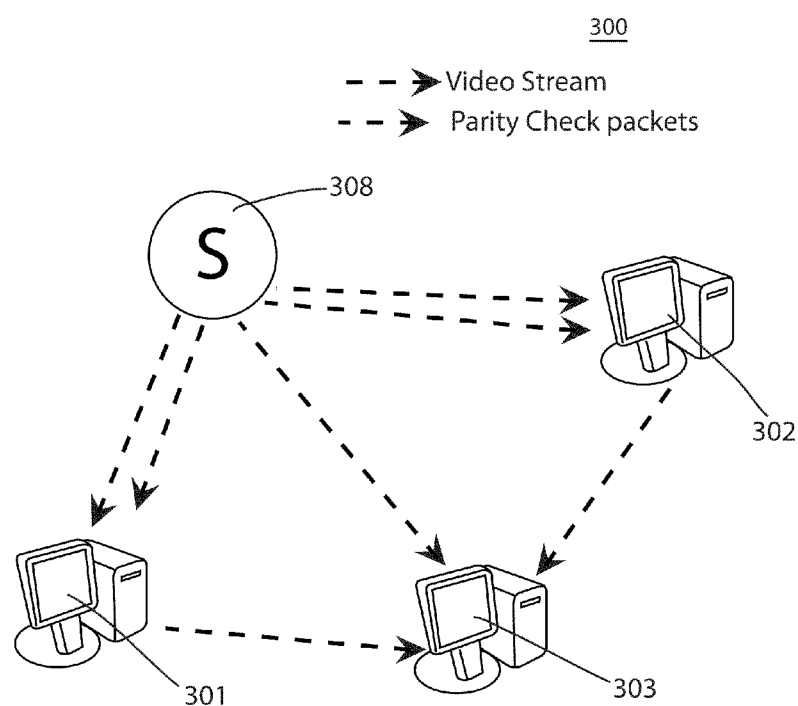
FIG. 3 shows a block diagram of one embodiment of another system for communicating over a network.

System 100 can be used in a variety of different applications. Two example applications are video multicast, as illustrated in FIG. 2 below, and peer-to-peer (P2P) networks, as illustrated in FIG. 3 below. However, the invention is not so limited, and the invention may be used in other contexts as well.

Illustrative Video Multicast Operating Environment

FIG. 2 illustrates a block diagram of an embodiment of a system (200) for communicating over a network. System 200 may be employed as an embodiment of system 100 of FIG. 1. System 200 includes a sender device 208, a first set of channel links 206, a second set of channel links 207, and receiving devices 201-203. Sender device 208 may be interchangeably referred to as an encoder device, and receiving devices 201-203 may be interchangeably referred to as decoder devices.

Sending device 208 may be an embodiment of server device 108 of FIG. 1. Sending device 208 is configured to multicast a video stream to a heterogeneous set of receiving devices (201-203), over a wireless medium such as Wireless Fidelity (WiFi), or over more than one medium (such as a wired medium and a wireless medium). For example, over a wireless medium, the access point may be designed to have the intelligence to distinguish the multimedia stream packets from other data packets that do not have the strict delay requirements of the streaming video. Each packet has a payload, and payload includes one or more symbols. In one embodiment, the payload of each packet is one symbol. In other embodiments, the payload of each packet includes two or more symbols.

The receiving devices 201-203 are heterogeneous receivers in that they have different burst-delay (B, T) parameters. A given set of burst-delay parameters (B,T) represents a guaranteed delay time T (in units of symbol duration) by which a burst duration of no greater than B (in units of symbol duration) can be recovered from. For example, a burst-delay parameter of (1,2) means that a burst erasure of one symbol must be recovered from by no later than a delay of two symbols. Different channel links may have different rates of packet losses and therefore have a different expected maximum burst erasure duration, and therefore different channel links may have a different value of B. Also, different users may have different delay tolerations and different video quality, and therefore have a different value of T, the maximum delay allowed to recover from a burst error. Channel links in set of channel links 206 (channel link 261 and channel link 262) have one set of burst-delay parameters ($B_1$, $T_1$), and channel links in set of channel links 207 (channel link 263) have a second set of burst-delay parameters ($B_2$, $T_2$) that is not identical to the first set of burst-delay parameters. For example, in one embodiment, each channel link in the set of channel links 206 may have burst-delay parameters of (1,2) (meaning that each channel link in the set of channel links 206 has a maximum burst erasure duration of one symbol, and that each receiver can recover from a burst erasure with a delay of two symbols), and that each channel link in the set of channel links 207 may have burst-delay parameters of (2,4) (meaning that each channel link in the set of channel links 207 has a maximum burst erasure duration of two symbols, and that each receiver can recover from a burst erasure with a delay of four symbols).

Sending device 208 includes an encoder 230 that is arranged to receive a stream of source packets including source symbols {s[t]} for t=0, 1, 2 . . . and produces a stream of channel packets including channel symbols {x[t]}. The channel symbol at time t depends on the source symbols up to time t, i.e., $x[t]=f_t(s[0], \ldots, s[t])$. The stream of channel packets is broadcast to receivers 271-273, for example, over a shared wireless channel. When the coded packet stream is broadcast over the channel links 261, 262, and 263, the streams that are received over the channel links by receiving devices 271, 272, and 273 respectively include $y_1[t]$, $y_2[t]$, and $y_3[t]$. The channel streams may include a burst erasure of a maximum duration indicated by the (B,T) parameters for that channel link. Each decoder (271, 272, and 273) is arranged to recover the source symbols s[t] using the error correction code to recover from a burst error, if a burst error occurred. The burst error is recovered from with a maximum delay according to the burst-delay parameter (B,T) according to the channel link—$T_1$ for the channel links in set of channel links 206, and $T_2$ for the channel links in set of channel links 207.

More formally, the burst-delay parameters may be explained as follows. Each receiver with the same set of burst-delay parameter may be treated as the same receiver so these purposes, so that the system may be regarded as a set of receivers, including a first receiver with delay parameter of (B1,T1), and so on. For each t≧0, receiver k outputs the source packet s[t] at time $t+T_k$ according to some function $s[t]=g_k(s[0], \ldots, s[t], s[t+1], \ldots, s[t+T_k])$.

The channel of receiver k experiences a burst of erasures of length $B_k$ i.e., for some $i_k \geqq 0$, $$y_k[t] = \begin{cases} x[t], & t \notin [j_k, j_k + B_k - 1] \\ \phi, & t \in [j_k, j_k + B_k - 1]. \end{cases}$$

Even though a channel link with a single erasure burst of length $B_k$, is discussed herein, the codes can deal with several bursts of erasures provided that they are separated sufficiently far enough.

Although a particular video multicasting example is discussed above, many variations are within the scope and spirit of the invention. For example, although two sets of (B,T) parameters were discussed above, one or more additional sets of (B,T) parameters may also be employed, so that another set of channel links may include burst-delay parameters ($B_3$,$T_3$), and so on. Further, in some embodiments, the decoders can dynamically adjust for a different burst delay than expected. For example, in an embodiment in which the error correction codes includes correction for ($B_1$,$T_1$)=(1,2) and ($B_2$,$T_2$)=(2, 4), if a given decoder expected a burst erasure duration of no greater than one symbol, and a corresponding delay of two symbols, but a burst erasure duration of two symbols is detected, in this embodiment, the decoder may recover the source symbols with a delay of four symbols. Further, in some embodiments, the video stream may be unicast to only a receiver with two or more sets of burst-delay parameters, and, when a burst erasure occurs, the delay to recover from the burst erasure varies in accordance with the duration of the burst erasure. The better the channel link, the lower is the incurred delay.

Illustrative Peer-to-Peer Operating Environment

FIG. 3 shows a block diagram of one embodiment of system (300), which is a peer-to-peer (P2P) network. P2P network 300 includes network devices, including sender device 308 and peer nodes 301-303.

P2P systems are highly vulnerable to peer churn effects which introduce packet losses (in bursts) at the receiving terminals. In one embodiment, an original video stream is delivered to all of the peer nodes (301-303) using a standard P2P protocol. In addition, sender device 308 generates a forward error correction (FEC) packet stream that each receiver subscribes to. This FEC stream includes the error correction code, and provides robustness whenever a receiver is subjected to burst erasures due to peer churns. The receivers are heterogeneous in that, for example, peer nodes 301 and 302 may be receiving the video stream from sender device 308, while 303 is receiving the video stream from peer nodes 301 and 302. The FEC packet stream is sent to all nodes. The FEC includes at least two different sets of burst-delay parameters, as previously discussed.

Illustrative Network Device

Figure 4:
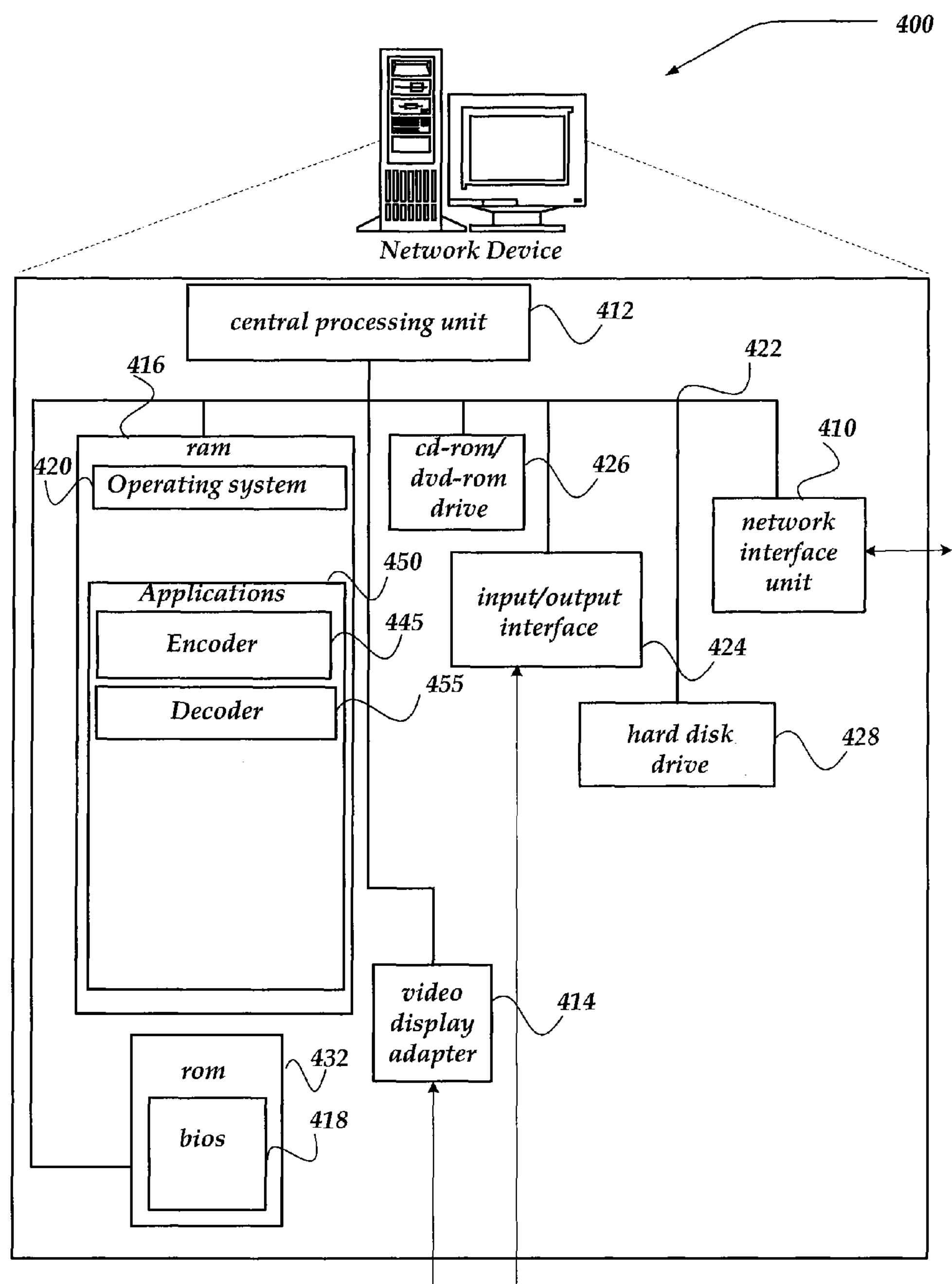
FIG. 4 shows a block diagram of one embodiment of a network device that may be included in a system implementing an embodiment of the invention.

FIG. 4 shows one embodiment of a network device, according to one embodiment of the invention. Network device 400 may include many more components than those shown. The components shown, however, are sufficient to disclose an illustrative embodiment for practicing the invention. Network device 400 may represent, for example, client device 101, 102, 103, or 104 of FIG. 1; server device 108 of FIG. 1; sender device 208 of FIG. 2; receiver device 201, 202, 203 of FIG. 2; sender device 308 of FIG. 3; or peer node 301, 302, or 303 of FIG. 3.

Network device 400 includes processing unit 412, video display adapter 414, and a mass memory, all in communication with each other via bus 422. The mass memory generally includes RAM 416, ROM 432, and one or more permanent mass storage devices, such as hard disk drive 428, tape drive, optical drive, and/or floppy disk drive. The mass memory stores operating system 420 for controlling the operation of network device 400. Any general-purpose operating system may be employed. Basic input/output system ("BIOS") 418 is also provided for controlling the low-level operation of network device 400. As illustrated in FIG. 4, network device 400 also can communicate with the Internet, or some other communications network, via network interface unit 410, which is constructed for use with various communication protocols including the TCP/IP protocol. Network interface unit 410 is sometimes known as a transceiver, transceiving device, or network interface card (NIC).

The mass memory as described above illustrates another type of computer-readable media, namely computer readable storage media. Computer readable storage media may include volatile, nonvolatile, removable, and non-removable media implemented in any method or technology for storage of information, such as computer readable instructions, data structures, program modules, or other data. Examples of computer storage media include RAM, ROM, EEPROM, flash memory or other memory technology, CD-ROM, digital versatile disks (DVD) or other optical storage, magnetic cassettes, magnetic tape, magnetic disk storage or other magnetic storage devices, or any other medium which can be used to store the desired information and which can be accessed by a computing device.

RAM 416 may include one or more data stores 452, which can be utilized by network device 400 to store, among other things, applications 450 and/or other data. RAM 416 can also be used to store database information. For example, data stores 452 may also be employed to store information that describes various user account information, user profiles, communication information, including, but not limited to, user related statuses, system default statuses, routine driven system derived statuses, user created conditions, goals, group information, user interfaces, and the like. At least a portion of the information of data stores 452 may also be stored on a disk drive or other storage medium (not shown) within network device 400, and/or in a remote storage mechanism.

The mass memory also stores program code and data. One or more applications 450 are loaded into mass memory and run on operating system 420. Examples of application programs may include transcoders, schedulers, calendars, database programs, word processing programs, HTTP programs, customizable user interface programs, IPSec applications, encryption programs, security programs, VPN programs, web servers, account management, and so forth. Applications 450 may include encoder 445 and/or decoder 455. Embodiments of network device 400 that are configured as a sender device may be configured to generate error correction code for at least two different burst-delay parameters $(B_1,T_1)$ and $(B_2,T_2)$. Embodiments of network device 400 that are configured as a receiver device may be configured to decode the error correction code for recovering from a burst erasure and/or a burst error.

Figure 5:
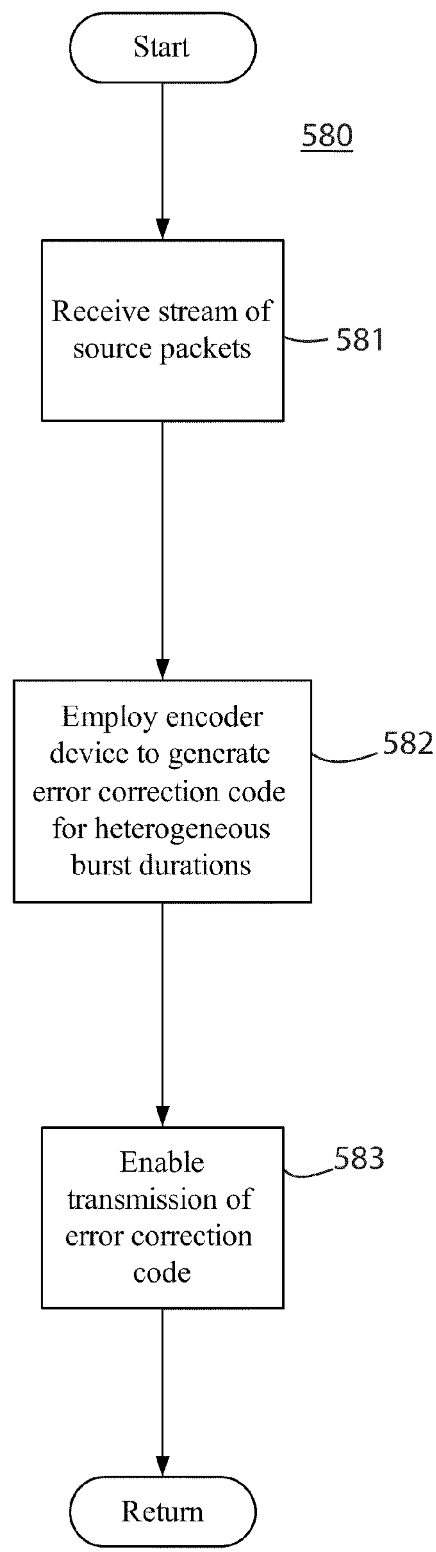
FIG. 5 illustrates a flow chart of an embodiment of a process for error correction coding.

FIG. 5 illustrates a flow chart of an embodiment of a process (580) for error correction coding. After a start block, the process proceeds to block 581, where a stream of source packets is received. The process then moves to block 582, where an encoder device is employed to generate error correction code for heterogeneous burst durations. The process then advances to block 583, where transmission of the error correction code is enabled. In some embodiments, the error correction code is provided within coded symbols, where each source symbol is encoded by concatenating the error correct at the end of the source symbol. In these embodiments, transmitting the coded source symbols acts to transmit both the source symbols and the error correction code. In other embodiments, the error correction code may be transmitted separately from the source symbols.

During a burst erasure, data is lost during the duration of the burst. More formally, as previously discussed, the channel of receiver k experiences a burst of erasures of length $B_k$ i.e., for some $i_k \geqq 0$, $$y_k[t] = \begin{cases} x[t], & t \notin [j_k,\ j_k + B_k - 1] \\ \phi, & t \in [j_k,\ j_k + B_k - 1]. \end{cases}$$

Figure 6:
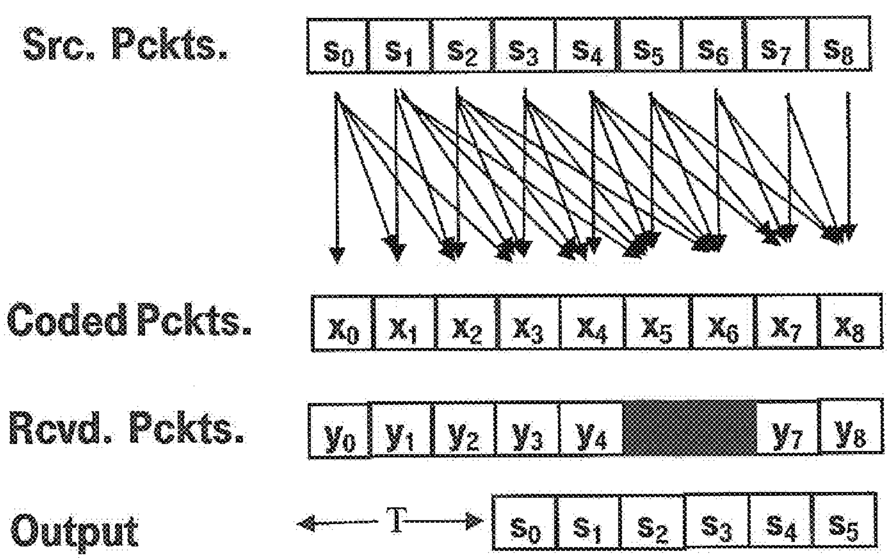
FIG. 6 shows an example of error correction code generation.

FIG. 6 shows an example of error correction coding and decoding for burst-delay parameters (B,T)=(2,3). In the embodiment shown, each packet includes one symbol, so that packets correspond to symbols in this embodiment.

The source packets include s0-s8. The packets are encoded to provide coded packets x0-x8 for transmission. Each packet includes the source symbols, and at least two error correction code portions. For example, packet x0 includes source packet s0, and at least two error correction code portions. One error correction code portion is for the burst-delay parameters (B,T)=(2,3). For this error code portion, symbols x0-x3 all depend on source packet s0. Similarly, for this error code portion, symbols x1-x4 all depend on symbol s1, and so on.

Received packets y0-y8 may have a burst erasure duration of up two symbols. Shown is an example of y5 and y6 missing due to burst erasure of a duration of two symbols. In the decoding, the source symbols are recovered with a delay of three symbols.

Figure 7:
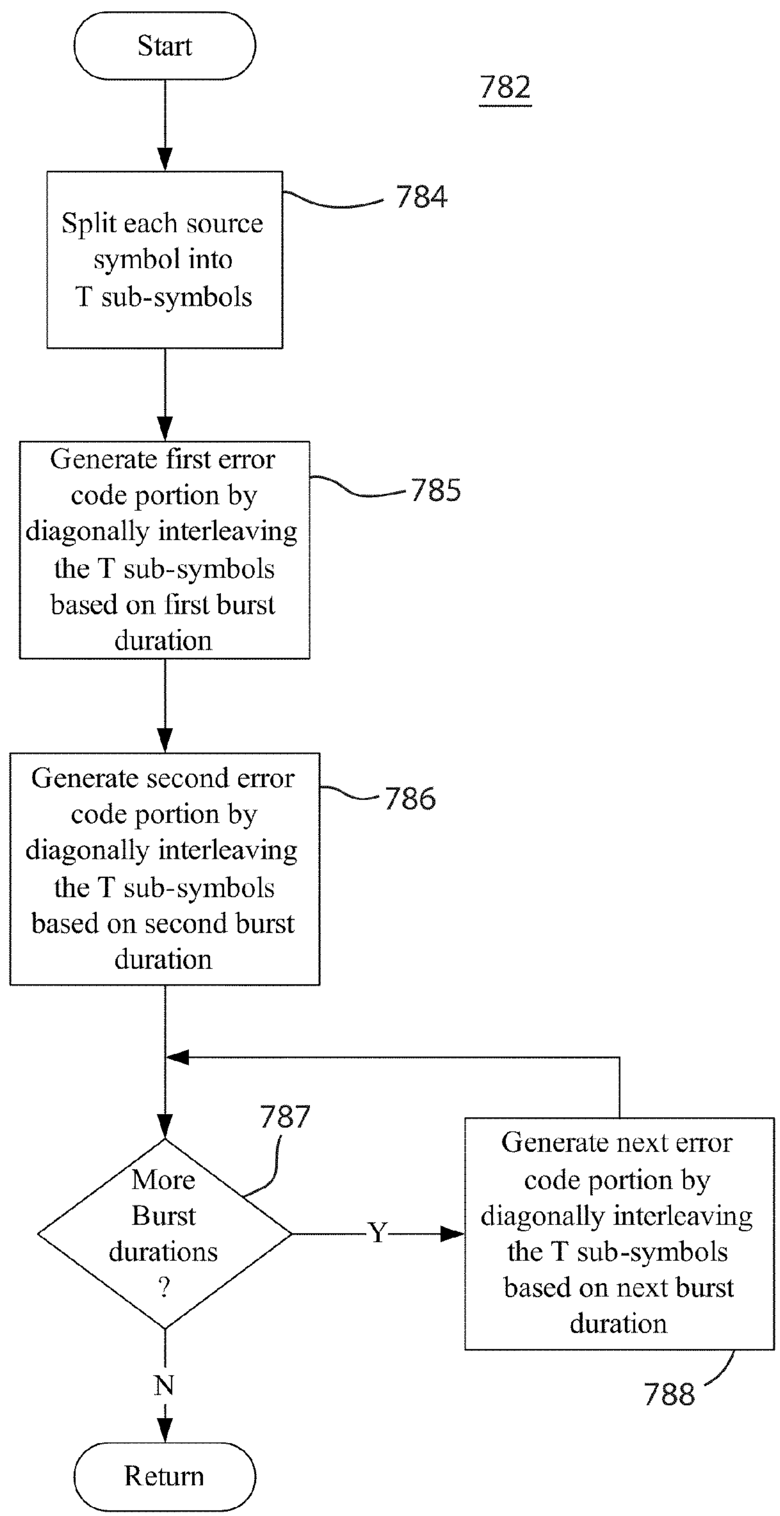
FIG. 7 illustrates a flow chart of an embodiment of the encoding step of FIG. 5.

FIG. 7 illustrates a flow chart of an embodiment of process 782, which is an embodiment of step 582 of FIG. 5. After a start block, the process proceeds to block 784, in which each source symbol is split into T sub-symbols. T is a multiple of $T_1, \ldots, T_k$, and is preferably the least common multiple of $T_1, \ldots, T_k$. For example, if the burst-delay parameter being coded for are $(B_1,T_1)=(1,2)$ and $(B_2,T_2)=(2,4)$, T is preferably 4, which is the least common multiple of 2 and 4. In this example, each source symbol is split into 4 sub-symbols of equal size. In this example, if each symbols contains 300K bits, then in one example, the first sub-symbol is the first 75K bits of the symbol, the second sub-symbol is the second 75K bits of the symbol, and so forth. If required, the last symbol may be padded with zeroes so that it has the same size as the remaining symbols.

The process then proceeds to block 785, where a first error code portion is generated by diagonally interleaving the T sub-symbols based on the first burst duration $(B_1)$, so that the resulting error code portion can correct a burst erasure of duration $B_1$ with a delay of $T_1$. In one embodiment, this is accomplished as follows. Where $(B_1,T_1)=(B,T)$ and $(B_2,T_2)=(\alpha B,\alpha T)$, the error code portion is generated by generating parity-check symbols for the first channels by defining the super-symbol $t_j[i]=(s_{\alpha j}[i], s_{\{\alpha j+1\}}[i], \ldots, s_{\{\alpha((j+1))-1)\}}[i])$, and compute the parity checks for the single-user (B, T) code. The parity-check symbols are generated by bitwise XORing of the sub-symbols. Since each super-symbol constitutes of a symbols and the (B, T) code produces a total of B parity-checks, the total number of parity symbols due to the first error code portion is $\alpha B$.

The process then moves to block 786, where a second error code portion is generated by diagonally interleaving the T sub-symbols based on the second burst duration ($B_2$), so that the resulting error code portion can correct a burst erasure of duration $B_2$ with a delay of $T_2$. In one embodiment, this is accomplished as follows. Using the super-symbol $t_j[i]=(s_{\alpha j}[i], s_{\{\alpha j+1)\}}[i], \ldots, s_{\{\alpha((j+1)-1)\}}[i])$, an additional $\alpha B$ parity checks are generated by bitwise XORing of the sub-symbols.

The process then advances to decision block 787, where a determination is made as to whether there are mode burst durations $B_T$ that are being coded for. If not, the process proceeds to a return block, where other processing is resumed. However, if the determination at decision block 787 is positive, the process moves to block 788, where the next error code portion is generated by diagonally interleaving the T sub-symbols based on the next burst duration $B_T$. The process then proceeds to decision block 787.

In one embodiment, each portion is concatenated together, with the coded symbols including the source symbols, with the first error code portion concatenated to the end of the source symbol, the second error code portion concatenated to the end of the first error code portion, and so on.

An example of the error code generation is illustrated in FIG. 8 below, in which the burst-delay parameters are $(B_1, T_1)=(1,2)$ and $(B_2,T_2)=(2,4)$. Each column shows a portion of the coded packet x[t], in which the sub-symbols of each row are concatenated together, so that the coded packet x[t−2] is a concatenation of: $s_0[i-2]$, $s_1[1-2]$, $s_2[i-2]$, $s_3[i-2]$, $s_0[i-6]\oplus s_2[i-4]$, $s_1[i-6]\oplus s_3[i-4]$, $s_0[i-4]\oplus s_2[i-3]$, and $s_1[i-4]\oplus s_3[i-3]$. The symbol $\oplus$ represents bitwise XORing. The first four rows of each column is the source symbols (which includes the four source symbols $s_0$-$s_3$), the fifth and sixth rows of each column is the first code portion for $(B_2, T_2)=(2,4)$, and the seventh and eighth rows of each column is the second code portion for $(B_1,T_1)=(1,2)$.

As shown, each source symbol is split into four sub-symbols. If the only correction had been for (B,T)=(1,2), then s would only need to be split into two sub-symbols, s0 and s1, with an error correction code of $(s_0[i-2]\oplus s_1[i-1])$. However, since s is split into four sub-symbols rather than two, the error code correction is instead $(s_0[i-2]\oplus s_2[i-1])$ concatenated with $(s_1[i-2]\oplus s_3[i-1])$.

Since each symbol is split into T sub-symbols, each sub-symbol from a given time t is diagonally interleaved to generate the error code portion for $(B_1,T_1)$ by including T coded sub-symbols over the next $T_1$ sub-symbols after time t, where each coded sub-symbol is provided by XORing the sub-symbol at time t with another sub-symbol from a time other than t (the sub-symbol at a time other than time t is a result of the diagonally interleaving of the sub-symbols from sub-symbols at times other than t). Similarly, each sub-symbol from a given time t is diagonally interleaved to generate the error code portion for $(B_2,T_2)$ by including T coded sub-symbols over the next $T_2$ sub-symbols after time t, where each coded sub-symbol is provided by XORing the sub-symbol at time t with another sub-symbol from a time other than t.

Figure 9:
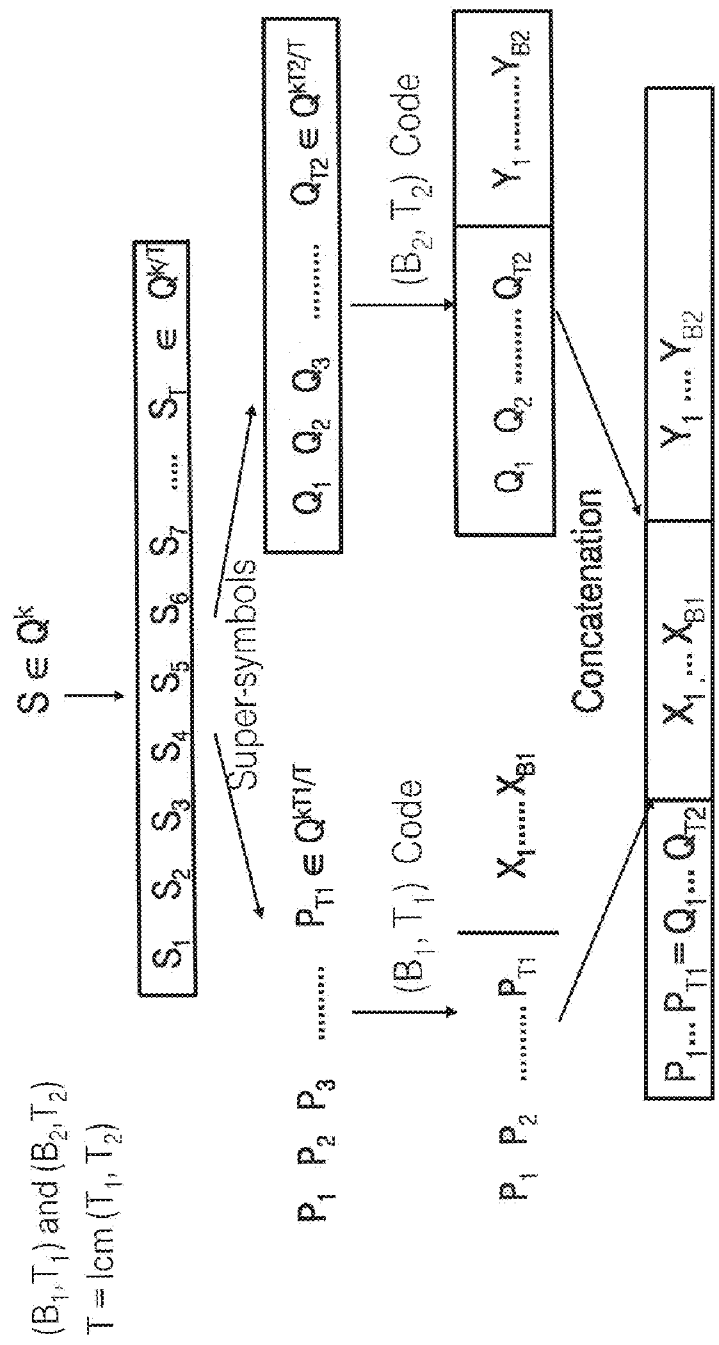
FIG. 9 illustrates a code construction for two different (B, T) parameters.

FIG. 9 illustrates an example of code construction for two different (B, T) parameters, for general values of $(B_1, T_1)$ and $(B_2, T_2)$. As previously discussed, T is a multiple of $T_1$ and $T_2$, and preferably the lowest common multiple of $T_1$ and $T_2$. As shown, s[i] is sub-divided into T sub-symbols of equal size. The code for $(B_1, T_1)$ is applied on super-symbols $t_{1j}[i]$ obtained by clustering $T/T_1$ information symbols, and code for $(B_2,T_2)$ is applied on super-symbols $t_{\{2j\}}[i]$ obtained by clustering $T/T_2$ information symbols. Finally, concatenation is performed so that each channel symbol includes the source symbol, the code for $(B_1, T_1)$, and the code for $(B_2,T_2)$.

Although FIG. 9 shows code constructions for two sets of burst-delay parameters, $(B_1, T_1)$ and $(B_2, T_2)$, the code construction may be extended for one or more additional sets of burst delay parameters, such as $(B_3, T_3)$, and so on.

Figure 10:
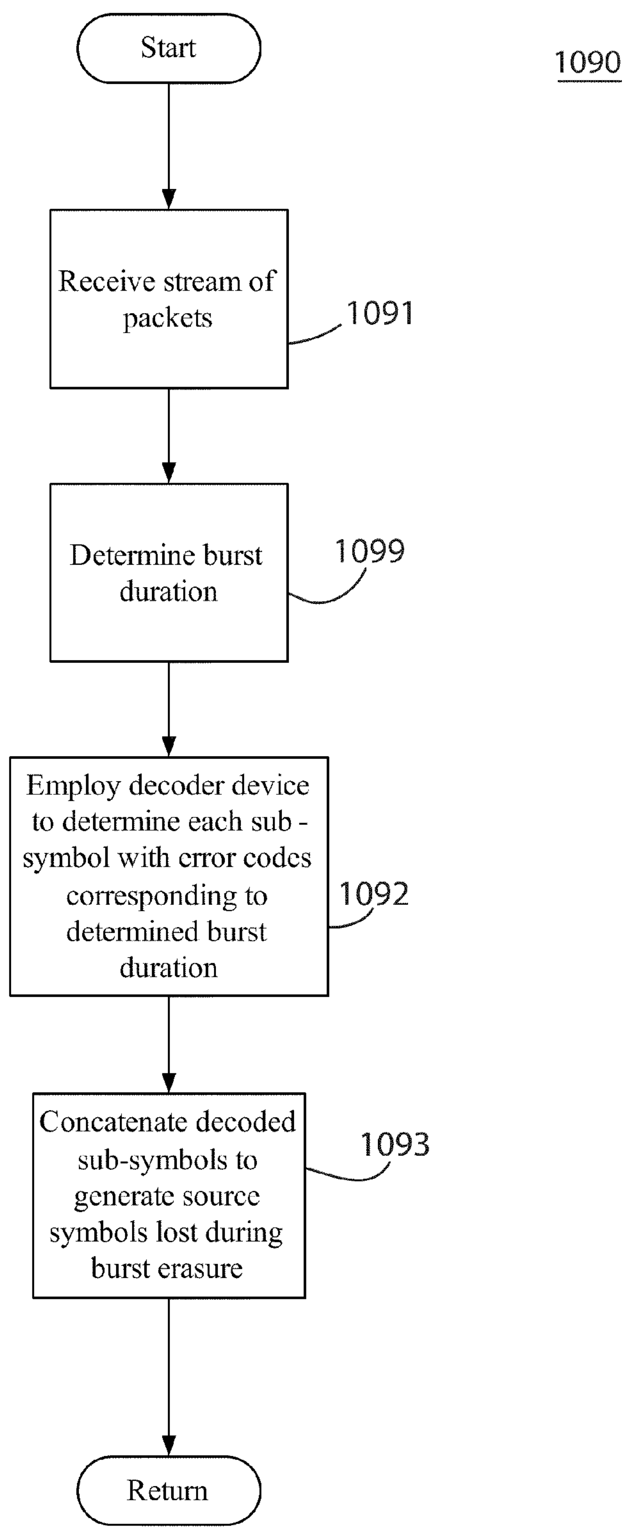
FIG. 10 shows a flow chart of an embodiment of decoding to recover from a burst erasure, in accordance with aspects of the present invention.

FIG. 10 shows a flowchart of an embodiment of a process (1090) of decoding to recover from a burst erasure or burst error. After a start block, the process proceeds to block 1091, where a stream of packets is received. The process then moves to block 1099, where the burst duration associated with a burst erasure or burst error of the stream of packets is determined. The process then advances to block 1092, where a decoder device is employed is used to determine each sub-symbol with error codes corresponding to the symbol(s) lost due to burst erasure, using the code corresponding to the determined burst duration. Where the encoding is accomplished by bitwise XORing, recovery of the sub-symbols can also be accomplished by bitwise XORing. The error codes for (B,T) values other than the one being decoded are ignored. For example, in the example shown in FIG. 8, if decoding is used to recover from a burst erasure of one symbol, then the fifth and sixth rows are ignored, and the error correction code in the seventh and eighth rows are used to recover from the burst erasure with a delay of two signals. However, if decoding is used to recover from a burst erasure of two symbols, then the seventh and eighth rows are ignored, and the error correction code in the fifth and sixth rows are used to recover form the burst erasure with a delay of four symbols.

The process then proceeds to block 1093, where the decoded sub-symbols are concatenated to generate the source symbols lost during the burst erasure (or burst error). The process then advances to a return block, where other processing is resumed.

For example, with the example code shown in FIG. 8, decoding to recover a burst erasure of symbol x[t−2] in two symbols can be accomplished by: XORing $s_0[i-3]$ from packet x[i−3] with $(s_0[i-3]\oplus s_2[i-2])$ from packet x[i−1] to recover $s_2[i-2]$; XORing $s_1[i-3]$ from packet x[i−3] with $(s_1[i-3]\oplus s_3[i-2])$ from packet x[i−1] to recover $s_3[i-2]$; XORing $s_2[i-1]$ from packet x[i−1] with $(s_0[i-2]\oplus s_2[i-1])$ from packet x[i] to recover $s_0[i-2]$; and XORing $s_3[i-1]$ from packet x[i−1] with $(s_1[i-2]\oplus s_3[i-1])$ from packet x[i] to recover $s_1[i-2]$. With $s_0[i-2]$, $s_1[i-2]$, $s_2[i-2]$, and $s_3[i-2]$ all recovered, they may be concatenated to provide the entire erased symbol s[i−2]. As shown, the symbols in the seventh and eighth row are used for (B,T)=(1,2), to recover from a burst erasure or burst error of duration of one symbol with a delay of two symbols. Symbols in the fifth and sixth row are used for (B,T)=(2,4), to recover from a burst erasure or burst error of two symbols with a delay of four symbols.

The quantity of interest is the information rate supported by the code constructions. This is the ratio of the entropy of the source packets to the entropy of the coded channel packets i.e., $$R = \frac{H(s)}{H(x)} b/s.$$

The resulting rate of an embodiment of the code discussed above is:

$$R = \frac{\alpha T}{2\alpha B + \alpha T} = \frac{T}{2B + T}.$$

For two users have burst-delay parameters $(B_1, T_1)$ and $(B_2, T_2)$ respectively, an embodiment of the code construction discussed above yields the following achievable rate $$R = \frac{1}{1 + \frac{T_1}{B_1} + \frac{T_2}{B_2}}.$$

Given burst delay parameters for the two users satisfy the relation that $(B_2, T_2)=(\alpha B, \alpha T)$ for some integer $\alpha>1$, an upper bound $C^+$ on the rate of any code that simultaneously satisfies both the receivers is $$C^+ = 1 - \frac{\alpha B}{\alpha T + (\alpha - 1)B}.$$

Proof:

Consider a single-burst channel that introduces a burst of length $\alpha B$ from times $t=0, 1, \ldots, (\alpha-I)B-1$. Applying the decoder of user 2 for $t=0, 1, \ldots, (\alpha-1)B-1$, the receiver recovers symbols $s[0], \ldots, s[t]$ with a delay of $\alpha T$ i.e., by time $T_1-1$, where $T_1=(\alpha-1)B+\alpha T$. Hence it also recovers the channel packets $x[0], \ldots, x[t]$ which are a function of the source packets. We now show that the symbols at time $t=(\alpha-1)B, \ldots, \alpha B-1$ are also recovered by time $T_1-1$. To recover these symbols we use the multicast property of the code as follows. Consider a channel that introduces a single erasure burst of length B between times $t=(\alpha-1)B, \ldots, \alpha B-1$. For this channel, using the decoder of user 1, the source symbols are recovered by time $\alpha B+T-1<T_1$. Thus by time $T_1$ all the erased packets are recovered. Finally note that this argument can be repeated to recover packets on a periodic burst erasure channel which erases $\alpha B$ packets with a period of $(\alpha-1)B+\alpha T$ symbols.

Since any code for the multicast burst-erasure channel can correct erasures on this periodic burst erasure channel, the rate of such a code is upper bounded by the capacity of the periodic erasure channel as expressed above.

The above specification, examples, and data provide a complete description of the manufacture and use of the composition of the invention. Since many embodiments of the invention can be made without departing from the spirit and scope of the invention, the invention also resides in the claims hereinafter appended.

What is claimed is:

1. A method for error correction coding, comprising:

receiving a stream of source packets, wherein the stream of source packets includes a plurality of source symbols;

employing an encoder device to generate an error correction code including, for each of the plurality of source symbols, a corresponding error code, such that each corresponding error code includes a first error code portion and a second error code portion, such that the first error code portion of each of the corresponding error codes is based on separating each of the source symbols in the plurality of source symbols into a plurality of sub-symbols and diagonally interleaving each of the sub-symbols in the plurality of sub-symbols based on a first burst duration, and such that the second error code portion of the corresponding error codes is based on diagonally interleaving each of the sub-symbols in the plurality of sub-symbols based on a second burst duration, wherein the first burst duration is different from the second burst duration; and enabling transmission of the error correction code.

2. The method of claim 1, wherein the diagonal interleaving of each of the sub-symbols includes bitwise XORing of the sub-symbols.

3. The method of claim 1, wherein employing the encoder device to generate the error correction code further includes generating, for each of the source symbols, a third error code portion such that the third error code portion of each of the corresponding error codes is based on diagonally interleaving each of the sub-symbols in the plurality of sub-symbols based on a third burst duration, wherein the third burst duration is different from the first burst duration and the second burst duration.

4. The method of claim 1, further comprising:

generating a plurality of channel symbols by concatenating each of the plurality of source symbols with the corresponding first error code portion and the corresponding second error code portion.

5. The method of claim 4, wherein the stream of source packets is a stream of video data, and wherein enabling transmission of the error correction code includes enabling multicasting of a stream of channel packets that includes the plurality of channel symbols.

6. The method of claim 1, wherein the first error code portion is coded to correct a burst erasure of B1 symbols with a delay of T1, the second error code portion is coded to correct a burst erasure of B2 symbols with a delay of T2, and wherein the separating of the source symbols into a plurality of source symbols is a separation of the symbol into T sub-symbols of equal size, wherein T is a multiple of T1 and T2.

7. The method of claim 6, wherein generating the each of the first error code portions includes:

generating the first error code portion of each sub-symbol by diagonally interleaving the T sub-symbols such that, for each source symbol time t, the first error code portion of the next T1 sub-symbols after the current source symbol include T sub-symbols, wherein each of the T sub-symbols includes a sub-symbol that is generated by bitwise XORing one of the sub-symbols from symbol time t with one of the sub-symbols from a time other than symbol time t.

8. The method of claim 7, wherein generating each of the second error code portions includes:

generating the second error code portion of each sub-symbol by diagonally interleaving the T sub-symbols such that, for each source symbol time t, the first error code portion of the next T2 sub-symbols after the current source symbol include T sub-symbols, wherein each of the T sub-symbols includes a sub-symbol that is generated by bitwise XORing one of the sub-symbols from symbol time t with one of the sub-symbols from a time other than symbol time t.

9. A non-transitory processor-readable medium having processor-executable code encoded therein, which when executed by one or more processors, enables actions for error correction coding, the actions comprising:

receiving a stream of source packets, wherein the stream of source packets includes a plurality of source symbols;

generating an error correction code including, for each of the plurality of source symbols, a corresponding error code, such that each corresponding error code includes a first error code portion and a second error code portion, such that the first error code portion of each of the corresponding error codes is based on separating each of the source symbols in the plurality of source symbols into a plurality of sub-symbols and diagonally interleaving each of the sub-symbols in the plurality of sub-symbols based on a first burst duration, and such that the second error code portion of the corresponding error codes is based on diagonally interleaving each of the sub-symbols in the plurality of sub-symbols based on a second burst duration, wherein the first burst duration is different from the second burst duration; and enabling transmission of the error correction code.

10. The non-transitory processor-readable medium of claim 9, wherein generating the error correction code further includes generating, for each of the source symbols, a third error code portion such that the third error code portion of each of the corresponding error codes is based on diagonally interleaving each of the sub-symbols in the plurality of sub-symbols based on a third burst duration, wherein the third burst duration is different from the first burst duration and the second burst duration.

11. An encoder device for error correction coding, comprising:

a processor that is arranged to enable actions, including:

receiving a stream of source packets, wherein the stream of source packets includes a plurality of source symbols; and generating an error correction code including, for each of the plurality of source symbols, a corresponding error code, such that each corresponding error code includes a first error code portion and a second error code portion, such that the first error code portion of each of the corresponding error codes is based on separating each of the source symbols in the plurality of source symbols into a plurality of sub-symbols and diagonally interleaving each of the sub-symbols in the plurality of sub-symbols based on a first burst duration, and such that the second error code portion of the corresponding error codes is based on diagonally interleaving each of the sub-symbols in the plurality of sub-symbols based on a second burst duration, wherein the first burst duration is different from the second burst duration; and a transceiver that is arranged to transmit that error correction code over a network.

12. The encoder device of claim 11, wherein the diagonal interleaving of each of the sub-symbols includes bitwise XORing of the sub-symbols.

13. The encoder device of claim 11, wherein the encoder device is arranged such that generating the error correction code further includes generating, for each of the source symbols, a third error code portion such that the third error code portion of each of the corresponding error codes is based on diagonally interleaving each of the sub-symbols in the plurality of sub-symbols based on a third burst duration, wherein the third burst duration is different from the first burst duration and the second burst duration.

14. The encoder device of claim 11, wherein the encoder device is arranged to generate a plurality of channel symbols by concatenating each of the plurality of source symbols with the corresponding first error code portion and the corresponding second error code portion.

15. The encoder device of claim 14, wherein the stream of source packets is a stream of video data, and wherein the encoder device is arranged such that enabling transmission of the error correction code includes enabling multicasting of a stream of channel packets that includes the plurality of channel symbols.

16. The encoder device of claim 11, wherein the encoder device is arranged such that the first error code portion is coded to correct a burst erasure of B1 symbols with a delay of T1, the second error code portion is coded to correct a burst erasure of B2 symbols with a delay of T2, and wherein the separating of the source symbols into a plurality of source symbols is a separation of the symbol into T sub-symbols of equal size, wherein T is a multiple of T1 and T2.

17. The encoder device of claim 16, wherein the encoder device is arranged such that generating the each of the first error code portions includes:

generating the first error code portion of each sub-symbol by diagonally interleaving the T sub-symbols such that, for each source symbol time t, the first error code portion of the next T1 sub-symbols after the current source symbol include B1*T sub-symbols, wherein each of the B1*T sub-symbols includes a sub-symbol that is generated by bitwise XORing one of the sub-symbols from symbol time t with one of the sub-symbols from a time other than symbol time t.

18. The encoder device of claim 17, wherein the encoder device is arranged such that generating each of the second error code portions includes:

generating the second error code portion of each sub-symbol by diagonally interleaving the T sub-symbols such that, for each source symbol time t, the first error code portion of the next T2 sub-symbols after the current source symbol include B2*T sub-symbols, wherein each of the B2*T sub-symbols includes a sub-symbol that is, generated by bitwise XORing one of the sub-symbols from symbol time t with one of the sub-symbols from a time other than symbol time t.

19. A decoder device for error correction coding, comprising:

a transceiver that is arranged to receive a stream of packet over a network; and a processor that is arranged to enable actions, including:

determining a burst duration associated with a burst erasure associated with the stream of packet or a burst error associated with the stream of packets;

decoding a portion of an error code that corresponds to the determined burst duration to determine each sub-symbol corresponding to source symbols lost due to the burst erasure or burst error; and concatenating each of the decoded sub-symbols to generate the source symbols lost due to the burst erasure or burst error.

20. The decoder device of claim 19, wherein the sub-symbols of the portion of the error code are diagonally interleaved based on the burst duration.

21. A system for error correction coding, comprising:

a encoder device that is arranged to perform actions, including:

receiving a stream of source packets, wherein the stream of source packets includes a plurality of source symbols;

generating an error correction code including, for each of the plurality of source symbols, a corresponding error code, such that each corresponding error code includes a first error code portion and a second error code portion, such that the first error code portion of each of the corresponding error codes is based on separating each of the source symbols in the plurality of source symbols into a plurality of sub-symbols and diagonally interleaving each of the sub-symbols in the plurality of sub-symbols based on a first burst duration, and such that the second error code portion of the corresponding error codes is based on diagonally interleaving each of the sub-symbols in the plurality of sub-symbols based on a second burst duration, wherein the first burst duration is different from the second burst duration; and transmitting the stream of source symbols and the error correction code over a network; and a decoder device that is arranged to perform actions, including:

receiving the stream of source symbols and the error correction code;

determining a burst duration associated with a burst erasure associated with the stream of source symbols or a burst error associated with the stream of source symbols;

decoding a portion of an error code that corresponds to the determined burst duration to determine each sub-symbol corresponding to source symbols lost due to the burst erasure or burst error; and concatenating each of the decoded sub-symbols to generate the source symbols lost due to the burst erasure or burst error.

* * * * *